(12) United States Patent
Briffa et al.

(10) Patent No.: US 9,768,732 B2
(45) Date of Patent: Sep. 19, 2017

(54) ASYMMETRIC MULTILEVEL BACKOFF AMPLIFIER WITH RADIO-FREQUENCY SPLITTER

(71) Applicant: Eta Devices, Inc., Cambridge, MA (US)

(72) Inventors: Mark A. Briffa, Tyreso (SE); Joel L. Dawson, Roslindale, MA (US); David J. Perreault, Andover, MA (US); Oguzhan Uyar, Cambridge, MA (US)

(73) Assignee: Eta Devices, Inc., Cambridge, MA (US)

( * ) Notice: Subject to any disclaimer, the term of this patent is extended or adjusted under 35 U.S.C. 154(b) by 0 days.

(21) Appl. No.: 15/354,170

(22) Filed: Nov. 17, 2016

(65) Prior Publication Data

US 2017/0070194 A1    Mar. 9, 2017

Related U.S. Application Data

(63) Continuation of application No. 14/920,031, filed on Oct. 22, 2015, which is a continuation-in-part of
(Continued)

(51) Int. Cl.
*H04B 1/04* (2006.01)
*H03F 1/02* (2006.01)
(Continued)

(52) U.S. Cl.
CPC ......... *H03F 1/0222* (2013.01); *H03F 1/0227* (2013.01); *H03F 1/3282* (2013.01);
(Continued)

(58) Field of Classification Search
CPC ..... H04B 1/04; H03F 1/04; H03F 1/02; H03F 3/68; H03F 1/025; H03F 3/60; H03F 3/20;
(Continued)

(56) References Cited

U.S. PATENT DOCUMENTS 4,129,839 A   12/1978  Galani et al.
4,835,493 A    5/1989  Walsh, Jr.
(Continued)

FOREIGN PATENT DOCUMENTS

EP   1 381 154 A1   1/2004
EP    170 366 A2    2/2007
(Continued)

OTHER PUBLICATIONS

U.S. Appl. No. 14/758,033, filed Jun. 26, 2015, Perreault et al.
(Continued)

*Primary Examiner* — Pablo Tran
(74) *Attorney, Agent, or Firm* — Daly, Crowley, Mofford & Durkee, LLP

(57) ABSTRACT

A radio frequency (RF) amplification system or transmitter includes one or more power amplifiers and a controller that is configured to adjust amplitudes and phases of RF input signals of the one or more power amplifiers and supply voltages applied to the one or more power amplifiers. The system may include a single digital-to-RF modulator and a power divider to drive multiple power amplifiers. A power combiner may also be provided to combine outputs of the power amplifiers. In at least one implementation, amplitude adjustment of the RF input signals of the one or more power amplifiers may be used to provide transmit power control and/or power backoff.

24 Claims, 4 Drawing Sheets

Related U.S. Application Data application No. 14/666,965, filed on Mar. 24, 2015, now Pat. No. 9,209,758, which is a continuation of application No. 14/338,671, filed on Jul. 23, 2014, now Pat. No. 9,020,453, which is a continuation of application No. 13/663,878, filed on Oct. 30, 2012, now Pat. No. 9,166,536, which is a continuation of application No. 13/663,887, filed on Oct. 30, 2012, now Pat. No. 8,824,978.

(60) Provisional application No. 62/185,803, filed on Jun. 29, 2015.

(51) Int. Cl.
  *H03F 3/68* (2006.01)
  *H03F 3/19* (2006.01)
  *H03F 3/21* (2006.01)
  *H03F 3/24* (2006.01)
  *H03G 3/30* (2006.01)
  *H03F 1/32* (2006.01)

(52) U.S. Cl.
  CPC .............. *H03F 3/19* (2013.01); *H03F 3/211* (2013.01); *H03F 3/245* (2013.01); *H03G 3/3042* (2013.01); *H04B 1/0483* (2013.01); *H03F 2200/451* (2013.01); *H03F 2200/504* (2013.01); *H03F 2200/511* (2013.01); *H03F 2201/3203* (2013.01); *H03F 2203/21106* (2013.01); *H03F 2203/21142* (2013.01); *H04B 2001/045* (2013.01)

(58) Field of Classification Search
  CPC .......... H03F 3/21; H03F 1/0294; H03F 3/602; H03F 3/211; H03F 2203/21163
  USPC ......... 455/127.3, 91, 102, 103, 114.1, 115.1, 455/115.2, 118, 126, 127.1, 127.2, 127.4; 375/296, 297; 330/124 R, 127, 129, 149
  See application file for complete search history.

(56) References Cited

U.S. PATENT DOCUMENTS

| | | | |
|---|---|---|---|
| 5,012,200 A | 4/1991 | Meinzer | |
| 5,561,395 A | 10/1996 | Melton et al. | |
| 5,847,602 A | 12/1998 | Su | |
| 5,892,395 A | 4/1999 | Stengel et al. | |
| 6,043,707 A | 3/2000 | Budnik | |
| 6,081,161 A | 6/2000 | Dacus et al. | |
| 6,133,788 A | 10/2000 | Dent | |
| 6,140,807 A | 10/2000 | Vannatta et al. | |
| 6,255,906 B1 | 7/2001 | Eidson et al. | |
| 6,327,462 B1 | 12/2001 | Loke et al. | |
| 6,377,117 B2 | 4/2002 | Oskowsky et al. | |
| 6,396,341 B1 | 5/2002 | Pehlke | |
| 6,449,465 B1 | 9/2002 | Gailus et al. | |
| 6,535,066 B1 | 3/2003 | Petsko | |
| 6,566,944 B1 | 5/2003 | Pehlke et al. | |
| 6,646,501 B1 | 11/2003 | Wessel | |
| 6,657,876 B2* | 12/2003 | Satoh ................... | H02J 7/0065 307/110 |
| 6,738,432 B2 | 5/2004 | Pehlke et al. | |
| 6,788,151 B2 | 9/2004 | Shvarts et al. | |
| 6,799,020 B1 | 9/2004 | Heidmann et al. | |
| 6,975,166 B2 | 12/2005 | Grillo et al. | |
| 6,995,995 B2* | 2/2006 | Zeng ...................... | H02M 3/07 327/536 |
| 7,068,984 B2 | 6/2006 | Mathe et al. | |
| 7,091,772 B2 | 8/2006 | Friedel et al. | |
| 7,103,114 B1 | 9/2006 | Lapierre | |
| 7,202,655 B2* | 4/2007 | Itoh ........................ | H02M 3/07 323/313 |
| 7,236,542 B2 | 6/2007 | Matero | |
| 7,279,971 B2 | 10/2007 | Hellberg et al. | |
| 7,317,412 B2 | 1/2008 | Li et al. | |
| 7,330,070 B2 | 2/2008 | Vaisanen | |
| 7,362,251 B2 | 4/2008 | Jensen et al. | |
| 7,411,449 B2 | 8/2008 | Klingberg et al. | |
| 7,420,415 B2 | 9/2008 | Lee et al. | |
| 7,423,477 B2 | 9/2008 | Sorrells et al. | |
| 7,440,733 B2 | 10/2008 | Maslennikov et al. | |
| 7,469,017 B2 | 12/2008 | Granstrom et al. | |
| 7,474,149 B2 | 1/2009 | Snelgrove et al. | |
| 7,482,869 B2 | 1/2009 | Wilson | |
| 7,505,747 B2 | 3/2009 | Solum | |
| 7,512,387 B2 | 3/2009 | Glueck | |
| 7,535,133 B2 | 5/2009 | Perreault et al. | |
| 7,555,059 B2 | 6/2009 | Rybicki et al. | |
| 7,583,149 B2 | 9/2009 | Funaki et al. | |
| 7,589,605 B2 | 9/2009 | Perreault et al. | |
| 7,705,681 B2 | 4/2010 | Ilkov | |
| 7,715,811 B2 | 5/2010 | Kenington | |
| 7,724,839 B2 | 5/2010 | Chen et al. | |
| 7,817,962 B2 | 10/2010 | Zolfaghari | |
| 7,881,401 B2 | 2/2011 | Kraut et al. | |
| 7,889,519 B2 | 2/2011 | Perreault et al. | |
| 7,907,429 B2* | 3/2011 | Ramadass ............... | H02M 3/07 307/110 |
| 7,956,572 B2 | 6/2011 | Zane et al. | |
| 7,962,111 B2 | 6/2011 | Solum | |
| 8,009,765 B2 | 8/2011 | Ahmed et al. | |
| 8,026,763 B2 | 9/2011 | Dawson et al. | |
| 8,072,264 B2 | 12/2011 | Gustavsson | |
| 8,155,237 B2 | 4/2012 | Ahmed | |
| 8,164,384 B2 | 4/2012 | Dawson et al. | |
| 8,174,322 B2 | 5/2012 | Heijden et al. | |
| 8,212,541 B2 | 7/2012 | Perreault et al. | |
| 8,315,578 B2 | 11/2012 | Zhu et al. | |
| 8,340,606 B2 | 12/2012 | Park et al. | |
| 8,416,018 B2 | 4/2013 | Yamauchi et al. | |
| 8,447,245 B2 | 5/2013 | Staudinger et al. | |
| 8,451,053 B2 | 5/2013 | Perreault et al. | |
| 8,493,142 B2 | 7/2013 | Tadano | |
| 8,536,940 B2 | 9/2013 | Bohn et al. | |
| 8,542,061 B2 | 9/2013 | Levesque et al. | |
| 8,548,400 B2 | 10/2013 | Traylor et al. | |
| 8,610,499 B2 | 12/2013 | Royer | |
| 8,611,459 B2 | 12/2013 | McCallister | |
| 8,659,353 B2 | 2/2014 | Dawson et al. | |
| 8,718,188 B2* | 5/2014 | Balteanu ................ | H03F 1/0227 323/271 |
| 8,773,201 B2 | 7/2014 | Yamamoto et al. | |
| 8,824,978 B2 | 9/2014 | Briffa et al. | |
| 8,829,993 B2 | 9/2014 | Briffa et al. | |
| 8,952,752 B1 | 2/2015 | Huettner | |
| 8,988,059 B2* | 3/2015 | Rutkowski ............... | H02J 1/00 323/272 |
| 8,995,502 B1 | 3/2015 | Lai et al. | |
| 9,020,453 B2 | 4/2015 | Briffa et al. | |
| 9,048,727 B2* | 6/2015 | Giuliano ................ | H02M 3/07 |
| 9,141,832 B2 | 9/2015 | Perreault et al. | |
| 9,450,506 B2* | 9/2016 | Perreault ............... | H02M 7/217 |
| 2003/0146791 A1 | 8/2003 | Shvarts et al. | |
| 2004/0100323 A1 | 5/2004 | Khanifar et al. | |
| 2004/0251964 A1 | 12/2004 | Weldon | |
| 2005/0062529 A1 | 3/2005 | Gan et al. | |
| 2005/0191975 A1 | 9/2005 | Talwalkar et al. | |
| 2005/0191976 A1 | 9/2005 | Shakeshaft et al. | |
| 2005/0248401 A1 | 11/2005 | Hellberg et al. | |
| 2007/0066224 A1 | 3/2007 | d'Hont et al. | |
| 2007/0066250 A1 | 3/2007 | Takahashi et al. | |
| 2007/0069818 A1 | 3/2007 | Bhatti et al. | |
| 2007/0123184 A1 | 5/2007 | Nesimoglu et al. | |
| 2007/0146090 A1 | 6/2007 | Carey et al. | |
| 2007/0159257 A1 | 7/2007 | Lee et al. | |
| 2007/0247222 A1 | 10/2007 | Sorrells et al. | |
| 2007/0247253 A1 | 10/2007 | Carey et al. | |
| 2007/0281635 A1 | 12/2007 | McCallister et al. | |
| 2007/0290747 A1 | 12/2007 | Traylor et al. | |
| 2007/0291718 A1 | 12/2007 | Chan et al. | |
| 2008/0001660 A1 | 1/2008 | Rasmussen | |
| 2008/0003960 A1 | 1/2008 | Zolfaghari | |

(56) References Cited

U.S. PATENT DOCUMENTS

| | | |
|---|---|---|
| 2008/0003962 A1 | 1/2008 | Ngai |
| 2008/0007333 A1 | 1/2008 | Lee et al. |
| 2008/0012637 A1 | 1/2008 | Aridas et al. |
| 2008/0019459 A1 | 1/2008 | Chen et al. |
| 2008/0085684 A1 | 4/2008 | Phillips et al. |
| 2008/0139140 A1 | 6/2008 | Matero et al. |
| 2008/0146171 A1 | 6/2008 | Hellberg et al. |
| 2008/0180171 A1 | 7/2008 | Brobston |
| 2008/0297246 A1 | 12/2008 | Taylor |
| 2010/0073084 A1 | 3/2010 | Hur et al. |
| 2010/0120384 A1 | 5/2010 | Pennec |
| 2010/0201441 A1 | 8/2010 | Gustavsson |
| 2011/0135035 A1 | 6/2011 | Bose et al. |
| 2011/0156815 A1 | 6/2011 | Kim et al. |
| 2011/0309679 A1 | 12/2011 | Fisher et al. |
| 2012/0176195 A1 | 7/2012 | Dawson et al. |
| 2012/0235736 A1 | 9/2012 | Levesque et al. |
| 2012/0252382 A1 | 10/2012 | Bashir et al. |
| 2012/0256686 A1 | 10/2012 | Royer |
| 2012/0313602 A1 | 12/2012 | Perreault et al. |
| 2012/0326684 A1 | 12/2012 | Perreault et al. |
| 2013/0241625 A1 | 9/2013 | Perreault et al. |
| 2013/0251066 A1 | 9/2013 | Kim et al. |
| 2013/0307618 A1 | 11/2013 | Anvari |
| 2013/0343106 A1 | 12/2013 | Perreault et al. |
| 2013/0343107 A1 | 12/2013 | Perreault |
| 2014/0118063 A1 | 5/2014 | Briffa et al. |
| 2014/0118065 A1 | 5/2014 | Briffa et al. |
| 2014/0118072 A1 | 5/2014 | Briffa et al. |
| 2014/0120854 A1 | 5/2014 | Briffa et al. |
| 2014/0125412 A1 | 5/2014 | Dawson et al. |
| 2014/0132354 A1 | 5/2014 | Briffa et al. |
| 2014/0167513 A1 | 6/2014 | Chang et al. |
| 2014/0225581 A1 | 8/2014 | Giuliano et al. |
| 2014/0226378 A1 | 8/2014 | Perreault |
| 2014/0335805 A1 | 11/2014 | Briffa et al. |
| 2015/0023063 A1* | 1/2015 | Perreault ............... H02M 3/337 363/17 |
| 2015/0084701 A1 | 3/2015 | Perreault |
| 2015/0155895 A1* | 6/2015 | Perreault ............. H04B 1/0458 455/127.3 |
| 2015/0194940 A1 | 7/2015 | Briffa et al. |
| 2016/0164466 A1 | 6/2016 | Briffa et al. |

FOREIGN PATENT DOCUMENTS

| | | |
|---|---|---|
| EP | 170 366 A3 | 2/2007 |
| EP | 1 609 239 B1 | 7/2010 |
| WO | WO 2005/106613 A1 | 11/2005 |
| WO | WO 2006/119362 A2 | 11/2006 |
| WO | WO 2007/082090 A2 | 7/2007 |
| WO | WO 2007/094921 A1 | 8/2007 |
| WO | WO 2007/136919 A2 | 11/2007 |
| WO | WO 2007/136919 A3 | 11/2007 |
| WO | WO 2009/153218 A1 | 12/2009 |
| WO | WO 2010/056646 A1 | 5/2010 |
| WO | WO 2011/097387 A1 | 8/2011 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2014/004241 A2 | 1/2014 |
| WO | WO 2014/028441 A2 | 2/2014 |
| WO | WO 2014/070474 A1 | 5/2014 |
| WO | WO 2014/070475 A1 | 5/2014 |
| WO | WO 2014/070998 A1 | 5/2014 |
| WO | WO 2014/085097 A1 | 6/2014 |

OTHER PUBLICATIONS

U.S. Appl. No. 14/791,685, filed Jul. 6, 2015, Perreault et al.
U.S. Appl. No. 14/837,616, filed Aug. 27, 2015, Briffa, et al.
U.S. Appl. No. 14/823,220, filed Aug. 11, 2015, Barton, et al.
U.S. Appl. No. 14/934,760, filed Nov. 6, 2015, Briffa, et al.
U.S. Appl. No. 14/968,045, filed Dec. 14, 2015, Perreault et al.
U.S. Appl. No. 14/974,563, filed Dec. 18, 2015, Perreault et al.
U.S. Appl. No. 14/975,742, filed Dec. 19, 2015, Perreault et al.
U.S. Appl. No. 15/149,491, filed May 9, 2016, Perreault, et al.
Sungwon Chung, et al., "Asymmetric Multilevel Outphasing Architecture for Multi-Standard Transmitters", 2009 IEEE Radio Frequency Integrated Circuits Symposium, pp. 237-240.
D. Diaz, et al., "Comparison of Two Different Cell Topologies for a Multilevel Power Supply to Achieve High Efficiency Envelope Amplifier", IEEE , 2009, pp. 25-30.
M. Rodriguez, et al., "Multilevel Converter for Enevlope Tracking in RF Power Amplifiers", IEEE, 2009, pp. 503-510.
Yuan-Jyue Chen, et al., "Multilevel LINC System Design for Wireless Transmitters", IEEE, 2007, pp. 1-4.
Jinsung Choi, et al., "A ΔΣ-Digitized Polar RF Transmitter", IEEE Transactions on Microwave Theory and Techniques, vol. 55, No. 12, Dec. 2007, pp. 2679-2690.
Kai-Yuan Jheng, et. al., "Multilevel LINC System Design for Power Efficiency Enhancement", IEEE, 2007, pp. 31-34.
Kevin Tom, et al., "Load-Pull Analysis of Outphasing Class-E Power Amplifier", The $2^{nd}$ International Conference on Wireless Broadband and Ultra Wideband Communications (AusWireless 2007), IEEE, 2007, pp. 1-4.
Surya Musunuri, et al., "Improvement of Light-Load Efficiency Using Width-Switching Scheme for CMOS Transistors", IEEE Power Electronics Letters, vol. 3, No. 3, Sep. 2005, pp. 105-110.
Frederick H. Raab, et al., "RF and Microwave Power Amplifier and Transmitter Technologies—Part 3", Sep. 2003, High Frequency Electronics, Summit Technical Media, LLC., pp. 34-48.
Petri Eloranta, et al., "A multimode Transmitter in 0.13 μm CMOS Using Direct-Digital RF Modulator", IEEE Journal of Solid-State Circuits, vol. 42, No. 12, Dec. 2007, pp. 2774-2784.
Invitation to Pay Additional Fees in PCT/US2009/063821 dated Feb. 9, 2010.
PCT Search Report of the ISA dated Apr. 13, 2010.
PCT Written Opinion of the ISA dated Apr. 13, 2010.
International Preliminary Report on Patentability of the ISA for PCT/US2009/063821 dated May 26, 2011.
Amendment to Office Action dated Apr. 7, 2011 (U.S. Appl. No. 12/680,048, filed Mar. 25, 2010).
Response to Ruie 161 communication dated Jun. 28, 2011; Jan. 9, 2012.
U.S. Appl. No. 12/615,696, filed Nov. 10, 2009.
U.S. Appl. No. 13/106,195, filed May 12, 2011.
U.S. Appl. No. 13/423,909, filed Mar. 19, 2012.
U.S. Appl. No. 13/423,909, flied Mar. 19, 2012.
Beltran, et al.; "HF Outphasing Transmitter Using Class-E Power Amplifiers;" Microwave Symposium Digest, IEEE; Jun. 2009; pp. 757-760.
Bifrane, et al.; "On the Linearity and Efficiency of Outphasing Microwave Amplifiers;" IEEE Transactions on Microwave Theory and Techniques; vol. 52; No. 7; Jul. 2004; pp. 1702-1708.
Chen, et al.; "A High Efficiency Outphasing Transmitter Structure for Wireless Communications;" Digital Signal Processing Workshop, IEEE; Jan. 2009, pp. 348-352.
Chireix; "High Power Outphasing Modulation;" Proceedings of the Institute of Radio Engineers; vol. 23; No. 11; Nov. 1935; pp. 1370-1392.
Cox; "Linear Amplification with Nonlinear Components;" IEEE Transactions on Communications; Dec. 1974; pp. 1942-1945.
El-Hamamsy; "Design of High-Efficiency RF Class-D Power Amplifier;" IEEE Transactions on Power Electronics; vol. 9; No. 3; May 1994; pp. 297-308.
Eun, et al.; "A High Linearity Chireix Outphasing Power Amplifier Using Composite Right/Left-Handed Transmission Lines;" Proceedings of the $37^{th}$ European Microwave Conference; Oct. 2007; pp. 1622-1625.
Everitt, et al.; *"Communication Engineering;"* $3^{rd}$ Edition, Chapter 11, pp. 403-450, New York: McGraw-Hill, 1956.
Gerhard, et al.; "Improved Design of Outphasing Power Amplifier Combiners;" 2009 German Microwave Conference; Mar. 2009; pp. 1-4.

(56) References Cited

OTHER PUBLICATIONS

Godoy, et al.; "Outphasing Energy Recovery Amplifier With Resistance Compression for Improved Efficiency;" IEEE Transactions on Microwave Theory and Techniques; vol. 57; No. 12; Dec. 2009; pp. 2895-2906.

Hakala, et al., "A 2.14-GHz Chireix Outphasing Transmitter;" IEEE Transactions on Microwave Theory and Techniques; vol. 53; No. 6; Jun. 2005; pp. 2129-2138.

Hakala, et al.; Chireix Power Combining with Saturated Class-B Power Amplifiers; 12$^{th}$ GAAS Symposium; Oct. 2004, pp. 379-382.

Hamill; "Impedance Plan Analysis of Class DE Amplifier;" Electronics Letters; vol. 30; No. 23; Nov. 10, 1994; pp. 1905-1906.

Hamill; "Time Reversal Duality Between Linear Networks;" IEEE Transactions on Circuits and Systems-I: Fundamental Theory and Applications; vol. 43; No. 1; Jan. 1996; pp. 63-65.

Hamill; "Time Reversal Duality in Dc-Dc Converters;" Power Electronics Specialists Conference, IEEE; vol. 1; Jun. 1997; 7 pages.

Han, et al.; "Analysis and Design of High Efficiency Matching Networks;" IEEE Transactions on Power Electronics; vol. 21; No. 5, Sep. 2006; pp. 1484-1491.

Han, et al.; "Resistance Compression Networks for Radio-Frequency Power Conversion;" IEEE Transactions on Power Electronics; vol. 22; No. 1; Jan. 2007; pp. 41-53.

Honjo; "A Simple Circuit Synthesis Method for Microwave Class-F Ultra-High-Efficiency Amplifiers with Reactance-Compensation Circuits;" Solid-State Electronics 44; Feb. 2000; pp. 1477-1482.

Hur, et al.; "A Muiti-Level and Multi-Band Class-D CMOS Power Amplifier for the LINC System in the Cognitive Radio Application;" IEEE Microwave and Wireless Components Letters; vol. 20; Issue 6; Jun. 2010; pp. 1-3.

Hur, et al.; "Highly Efficient and Linear Level Shifting Digital LINC Transmitter with a Phase Offset Cancellation;" Radio & Wireless Symposium; Jan. 2009; pp. 211-214.

Hur, et al.; "Highly Efficient Uneven Multi-Level LINC Transmitter;" Electronics Letters; Jul. 30, 2009; vol. 45; No. 16; 2 pages.

Kee, et al.; "The Class-E/F Family of ZVS Switching Amplifiers;" IEEE Transactions on Microwave Theory and Techniques; vol. 51; No. 6; Jun. 2003; pp. 1677-1690.

Kruass, et al.; *Solid State Radio Engineering*; Chapter 14, New York: Wiley, 1980.

Langridge, et al.; "A Power Re-Use Technique for improved Efficiency of Outphasing Microwave Power Amplifiers;" IEEE Transactions on Microwave Theory and Techniques; vol. 47; No. 8; Aug. 1999; pp. 1467-1470.

Lee; *Planar Microwave Engineering*; Chapter 20, pp. 630-687, New York: Cambridge University Press, 2004.

Lepine, et al.; "L-Band LDMOS Power Amplifiers Based on an Inverse Class-F Architecture;" IEEE Transactions on Microwave Theory and Techniques; vol. 53; No. 6; Jun. 2005; pp. 2007-2012.

Ni, et al.; "A New Impedance Match Method in Serial Chireix Combiner;" 2008 Asia-Pacific Microwave Conference; Dec. 2008; pp. 1-4.

Perreeult; A New Power Combining and Outphasing Modulation System for High-Efficiency Power Amplification; Circuits and Systems (MWSCAS), 53$^{rd}$ IEEE, International Midwest Symposium; Aug. 2010; pp. 1-14.

Phinney, et al.; "Radio-Frequency Inverters with Transmission-Line Input Networks;" IEEE Transactions on Power Electronics; vol. 22; No. 4; Jul. 2007; pp. 1154-1161

Qureshi, et al.; "A 90-W Peak Power GaN Outphasing Amplifier with Optimun Input Signal Conditioning;" IEEE Transactions on Microwave Theory and Techniques; vol. 57; No. 8; Aug. 2009; pp. 1925-1935.

Raab; "Class-F Power Amplifiers with Maximally Rat Waveforms;" IEEE Transactions on Microwave Theory and Techniques; vol. 45; No. 11; Nov. 1997; pp. 2007-2012.

Raab; "Efficiency of Outphasing RF Power-Amplifier Systems;" IEEE Transactions on Communications; vol. Com-33; No. 10; Oct. 1985; pp. 1094-1099.

Raab, et al.; "RF and Microwave Power Amplifier and Transmitter Technologies—Part 3;" High Frequency Electronics; Sep. 2003; pp. 34-48.

Rivas, et al.; "A High-Frequency Resonant Inverter Topology with Low-Voltage Stress;" IEEE Transactions on Power Electronics; vol. 23; No. 4; Jul. 2008; pp. 1759-1771.

Sokal, et al.; "Class E-A New Class of High-Efficiency Tuned Single-Ended Switching Power Amplifiers;" IEEE Journal of Solid-State Circuits; vol. SC-10; No. 3; Jun. 1975; pp. 168-176.

Sokal; "Class-E RF Power Amplifiers;" QEX; Jan./Feb. 2001; pp. 9-20.

Yao, et al.; "Power Amplifier Selectlon for LINC Applications;" IEEE Transactions on Circuits and Systems-II: Express Briefs; vol. 53; No. 8; Aug. 2006; pp. 763-767.

Zhang, et al.; "Analysis of Power Recycling Techniques for RF and Microwave Outphasing Power Amplifiers;" IEEE Transactions on Circuits and Systems-II: Analog and Digital Signal Processing; vol. 49; No. 5; May 2002; pp. 312-320.

Zhou, et al.; "A Distributed Active Transformer Coupled Outphasing Power Combiner;" IEEE Microwave Conference; Dec. 2009; pp. 2565-2568.

Zhukov, et al.; "Push-pull switching oscillator without commutating losses," Poluprovodnikovye Pribory v. Tekhnike Elektrosvyazi, No. 15, Jan. 1975, 8 pages.

Xu, et al.; "A 28.1dBm class-D outphasing power amplifier in 45nm LP digital CMOS;" Symposium on VLSI Circuits Digest of Technical Papers; Jun. 16, 2009; pp. 206-207.

Zhou, et al.; "A Distributed Active Transformer Coupled Outphasing Power Combiner," Microwave Conference, IEEE; Dec. 7, 2009; pp. 2565-2568.

PCT Search Report of the ISA for PCT/US2011/023613 dated May 30, 2011.

PCT Written Opinion of the ISA for PCT/US2011/023613 dated May 30, 2011.

International Preliminary Report on Patentability of the ISA for PCT/US2011/023613 dated Aug. 16, 2012.

U.S. Appl. No. 13/020,568, filed Feb. 3, 2011.

Cripps; "RF Power Amplifier for Wireless Communications, 2$^{nd}$ Ed.;" Chapter 14, Artech House, Boston, MA; Jan. 2006.

Godoy, et al.; "A 2.4-GHz, 27-dBm Asymmetric Multilevel Outphasing Power Amplifier in 65-nm CMOS;" IEEE Journal of Solid-State Circuits; vol. 47; No. 10; Oct. 2012; pp. 2372-2384.

Raab; "Average Efficiency of Class-G Power Amplifiers;" IEEE Transactions on Consumer Electronics; vol. CE-32; No. 2; May 1986; pp. 145-150.

Shirvani, et al.; "A CMOS RF Power Amplifier With Parallel Amplification for Efficient Power Control;" IEEE Journal of Solid-State Circuits; vol. 37; No. 6; Jun. 2002; pp. 684-693.

Vasic, et al.; "Multilevel Power Supply for High Efficiency RF Amplifiers;" 2009 IEEE Applied Power Electronics Conference; pp. 1233-1238; Feb. 2009.

Walling, et al.; "A Class-G Supply Modulator and Class-E PA in 130 nm CMOS;" IEEE Journal of Solid-State Circuits; vol. 44; No. 9; Sep. 2009; pp. 2339-2347.

Yan, et al.; "A High Efficiency 780 MHz GaN Envelope Tracking Power Amplifier," 2012 Compound Semiconductor Integrated Circuits Syumposium; Oct. 2012; pp. 1-4.

Yousefzadeh, et al.; "Three-Level Buck Converter for Envelope Tracking Applications;" IEEE Transactions on Power Electronics; vol. 21; No. 2; Mar. 2006; pp. 849-552.

Heijden, et al.; "A 19W High-Efficiency Wide-Band CMOS-GaN Class-E Chireix RF Outphasing Power Amplifier" Microwave Symposium Digest (MMT), 2011 IEEE MTT-S International; Jun. 5-10, 2011; 4 pages.

PCT Search Report of the ISA for PCT/US2013/065552 dated Mar. 20, 2014.

Written Opinion of the ISA for PCT/US2013/065552 dated Mar. 20, 2014.

PCT Search Report of the ISA for PCT/US2013/065553 dated Mar. 20, 2014.

Written Opinion of the ISA for PCT/US2013/065553 dated Mar. 20, 2014.

(56) References Cited

OTHER PUBLICATIONS

Notice of Allowance for U.S. Appl. No. 13/663,887, filed Oct. 30, 2012.
PCT Search Report of the ISA for PCT/US2013/70027 dated Apr. 22, 2014.
PCT Written Opinion of the ISA for PCT/US2013/70027 dated Apr. 22, 2014.
U.S. Appl. No. 13/663,878.
U.S. Appl. No. 13/663,887.
U.S. Appl. No. 14/338,671.
U.S. Appl. No. 14/666,965.
U.S. Appl. No. 13/833,050.
U.S. Appl. No. 14/064,572.
U.S. Appl. No. 13/955,952.
Office Action dated May 23, 2014 from U.S. Appl. No. 13/663,878, filed Oct. 30, 2012; 20 Pages.
Response to Office Action dated May 23, 2014 as filed on Jul. 31, 2014 from U.S. Appl. No. 13/663,878, filed Oct. 30, 2012; 7 Pages.
Office Action dated Oct. 29, 2014 for U.S. Appl. No. 13/633,878, filed Oct. 30, 2012; 15 Pages.
Response filed Dec. 30, 2014 of Office Action dated Oct. 29, 2014 for U.S. Appl. No. 13/663,878, filed Oct. 30, 2012; 20 Pages.
Office Action dated Jan. 26, 2015 for U.S. Appl. No. 13/955,952, filed Jul. 31, 2013; 30 Pages.
Office Action dated Feb. 23, 2015; for U.S. Appl. No. 14/064,572, filed Oct. 28, 2013; 29 Pages.
Notice of Allowance dated Jul. 14, 2014 for U.S. Appl. No. 13/833,050, filed Mar. 15, 2013; 23 Pages.
Response filed Mar. 10, 2015 of Office Action dated Feb. 23, 2015 for U.S. Appl. No. 14/064,572, filed Oct. 28, 2013; 3 Pages.
Office Action dated Apr. 24, 2015 for U.S. Appl. No. 14/064,572; 10 Pages.
Office Action dated May 7, 2015 for U.S. Appl. No. 13/663,878, filed Oct. 30, 2012; 23 Pages.
PCT International Preliminary Report on Patentability dated May 14, 2015 for Intl. Application No. PCT/US2013/06552; 13 Pages.
PCT International Preliminary Report on Patentability dated May 14, 2013 for Intl. Application No. PCT/US2013/06553; 13 Pages.
Response to Office Action dated Feb. 23, 2015 for U.S. Appl. No. 14/064,572; Response filed on Mar. 10, 2015; 3 Pages.
Response to Office Acton dated Jan. 26, 2015 for U.S. Appl. No. 13/955,952; Response filed on May 26, 2015; 11 Pages.
Office Action dated Jun. 2, 2015 for U.S. Appl. No. 13/663,878; 18 Pages.
Office Action dated Jul. 8, 2015 for U.S. Appl. No. 13/955,952; 13 Pages.
PCT International Preliminary Report on Patentability dated Jun. 2, 2015 for Intl. Application No. PCT/US2013/070027; 12 Pages.
Response to Office Action dated Apr. 24, 2015 for U.S. Appl. No. 14/064,572; Response filed on Jul. 17, 2015; 9 Pages.
Response to Final Office Action dated Jun. 2, 2015 for U.S. Appl. No. 13/663,878; Response filed on Jul. 21, 2015; 13 Pages.
Notice of Allowance dated Aug. 3, 2015 for U.S. Appl. No. 14/064,572; 13 Pages.
Notice of Allowance dated Jul. 29, 2015 for U.S. Appl. No. 13/955,952; 11 Pages.
Notice of Allowance dated Aug. 13, 2015 for U.S. Appl. No. 13/663,878; 13 Pages.
Office Action dated May 21, 2015 for U.S. Appl. No. 14/666,965; 15 Pages.
Response to Office Action dated May 21, 2015 corresponding to U.S. Appl. No. 14/666,965; Response filed on Jul. 23, 2015; 12 Pages.
Supplemental Response to Office Action dated May 21, 2015 corresponding to U.S. Appl. No. 14/666,965; Supplemental Response filed on Aug. 10, 2015; 9 Pages.
Notice of Allowance dated Aug. 25, 2015 corresponding to U.S. Appl. No. 14/666,965; 16 Pages.
European Extended Search Report dated Mar. 10, 2016 corresponding to European Application No. 3851200.9; 8 Pages.
Non-Final Office Action dated May 18, 2016; for U.S. Appl. No. 14/934,760, 31 pages.
European Extended Search Report dated May 17, 2016; for European Pat. App. No. 13851838.6, 8 pages.
Response filed on Jun. 3, 2016 to Non-Final Office Action dated May 18, 2016; for U.S. Appl. No. 14/934,760; 10 pages.
European Extended Search Report dated Jul. 4, 2016; for European Appl. No. 13858970.0; 7 pages.
Godoy et al.: "A 2.5-GHz asymmetric multilevel outphasing power amplifier in 65-nm CMOS"; Massachusetts Institute of Technology, *IEEE* 2011; pp. 57-60 (4 pages).
Notice of Allowance dated Jul. 7, 2016; for U.S. Appl. No. 14/934,760; 9 pages.
Notice of Allowance dated Aug. 24, 2016; for U.S. Appl. No. 14/920,031; 29 pages.
Non-Final Rejection dated Aug. 26, 2016; for U.S. Appl. No. 14/968,045; 30 pages.
Japanese Voluntary Amendment and Request for Examination (with English amended claims) filed Nov. 2, 2016; for Japanese Pat. App. 2015-544088; 17 pages.
Japanese Voluntary Amendment and Request for Examination (with English amended claims) filed Oct. 4, 2016; for Japanese Pat. App. 2015-539670; 19 pages.
Japanese Voluntary Amendment and Request for Examination (with English amended claims) filed Oct. 4, 2016; for Japanese Pat. App. 2015-539669; 19 pages.
Notice of Allowance dated Dec. 1, 2016 for European Patent Application No. 13/851,200.9; 60 Pages.
Response to Communication dated Dec. 5, 2016 with amended claims for European Patent Application No. 13/851,838.6; 7 Pages.
Response filed on Dec. 6, 2016 to Non-Final Office Action dated Sep. 15, 2016; for U.S. Appl. No. 14/837,616; 3 pages.
U.S. Appl. No. 15/287,068, filed Oct. 6, 2016, Briffa, et al.
U.S. Appl. No. 15/290,402, filed Oct. 11, 2016, Perreault, et al.
Communication pursuant to Article 94(3) EPC dated Jan. 5, 2017 for European Patent Application No. 13 851 838.6; 4 Pages.
Response to the Jul. 21, 2016 communication pursuant to Rules 72(2) and 70a(e) EPC from European Application No. 13858970.0 as filed on Jan. 31, 2017; 5 Pages.
Office Action dated Mar. 2, 2017 from U.S. Appl. No. 14/837,616; 13 Pages.
Office Action dated Feb. 24, 2017 from U.S. Appl. No. 14/968,045; 15 Pages.
Office Action dated Feb. 22, 2017 from U.S. Appl. No. 15/287,068; 43 Pages.
Response to Office Action dated Feb. 24, 2017 from U.S. Appl. No. 14/968,045, filed May 12, 2017; 9 Pages.
Response to Office Action dated Feb. 22, 2017 from U.S. Appl. No. 15/287,068, filed May 16, 2017; 8 Pages.
Response to Office Action dated Mar. 2, 2017 from U.S. Appl. No. 14/837,616, filed Jun. 1, 2017; 9 Pages.

* cited by examiner

ASYMMETRIC MULTILEVEL BACKOFF AMPLIFIER WITH RADIO-FREQUENCY SPLITTER

CROSS REFERENCE TO RELATED APPLICATIONS

This application is a continuation of U.S. application Ser. No. 14/920,031, filed Oct. 22, 2015, a continuation-in-part of U.S. application Ser. No. 14/666,965, filed Mar. 24, 2015, now U.S. Pat. No. 9,209,758, which claims the benefit under 35 U.S.C. §119(e) of U.S. Provisional Application No. 62/185,803 filed Jun. 29, 2015 and which is a continuation of U.S. application Ser. No. 14/338,671, filed Jul. 23, 2014, now U.S. Pat. No. 9,020,453, which is a continuation of U.S. application Ser. No. 13/663,878, filed Oct. 30, 2012, now U.S. Pat. No. 9,166,536 and U.S. application Ser. No. 13/663,887, filed Oct. 30, 2012, now U.S. Pat. No. 8,824,978, all of which applications are hereby incorporated by reference herein in their entireties.

BACKGROUND

As is known in the art, a radio frequency (RF) transmitter is a device that produces RF signals. RF transmitters may be included, for example, as part of a radio communication system that uses electromagnetic waves (radio waves) to transport information over a distance.

As is also known, a trade-off must generally be made in RF communications transmitters between energy efficiency and linearity. Over the decades of development of the RF transmitter and corresponding RF amplifiers, it has generally been true that one could obtain either high efficiency or high linearity, but not both. It would, therefore, be desirable to provide systems and techniques that allow a user to amplify RF signals and/or transmit data carrying RF signals with both high efficiency and high linearity.

U.S. Pat. No. 8,824,978, which is herein incorporated by reference in its entirety, describes a transmitter amplifier architecture (referred to herein as the "Asymmetric Multilevel Backoff Amplifier" or "AMBO amplifier") that has provides high efficiency operation at wide radio-frequency (RF) bandwidth with high linearity, efficient operation under power backoff, in addition to other advantages.

An AMBO amplifier may have plurality of RF power amplifiers (PAs) whose RF outputs are power combined to supply a system RF output, and whose PA drain bias voltages may be dynamically selected using voltage control units.

In known AMBO amplifiers, one way to drive the RF inputs of the PAs is for a controller to synthesize a digital command (e.g., an I/Q signal pair) for each PA. The digital commands are converted, through the use of two or more digital-to-RF modulators, into RF input signals for the PAs. By coordinating the switching of the PA drain bias voltages and the RF input commands to the PAs, an RF output can be generated that accurately reflects a desired digital I/Q input while preserving high efficiency and linearity at high bandwidth and across a wide range of power levels.

This implementation of AMBO with multiple digital-to-RF conversion paths is referred to herein as "dual-digital" AMBO.

SUMMARY

Systems and techniques are described for amplifying and subsequently transmitting radio frequency (RF) signals with both high efficiency and high linearity.

In one embodiment, a digital-to-RF modulator provides an RF signal to an RF splitter configured to split the RF signal into a plurality of RF signals which are coupled to RF inputs of a like plurality of RF amplifiers. With this particular arrangement, digital control may be maintained over the amplitudes and the phases of RF input signals applied to one or more power amplifiers (PAs). Digital control may also be maintained over the supply voltages applied to the one or more PAs. In some embodiments, non-linear power amplifiers may be used to achieve high power efficiency within an RF transmitter. Digital control techniques may be used to achieve linearity and to further enhance efficiency. In at least one implementation, the amplitudes of one or more RF input signals of the one or more power amplifiers may be controlled to achieve backoff in the power amplifier to generate a desired output power level.

It is appreciated herein that dual-digital AMBO imposes certain limitations on system design and operation. First, requiring multiple digital-to-RF modulators (and associated digital-to-analog converters and I/Q modulators) can be expensive, representing a cost disadvantage as compared to systems utilizing only a single digital-to-RF path. Second, control and linearization considerations become much more complicated as compared to a system with a single digital-to-RF path. This includes computational costs (e.g., component cost and power dissipation) and challenges in realizing linearization (e.g., with digital predistortion), maintaining time alignment among the multiple paths, implementing signal correction such as "pulse cancellation", etc. Moreover, these challenges become more pronounced as the number of PAs increases and/or at higher bandwidth operation, owing to the difficulty of providing all of the necessary computations and commands to the multiple digital paths and the multiple following RF paths.

According to one aspect of the disclosure, an RF amplification system comprises a digital-to-RF modulator to generate a modulated RF signal based on input information indicative of amplitude values and phase values; a plurality of RF amplifiers; an RF power divider to split the modulated RF signal into a plurality of RF input signals for the plurality of RF amplifiers; at least one voltage control unit to provide variable supply voltages to the plurality of RF amplifiers in response to at least one control signal; and a controller to receive input data and to provide the input information to the digital-to-RF modulator and the at least one control signal to the at least one voltage control unit based, at least in part, upon the received input data.

According to one aspect of the disclosure, an RF amplification system comprises a digital-to-RF modulator having a digital input port and an RF output port; a plurality of RF amplifiers, each of the RF amplifiers having an RF input port and an RF output port; an RF power divider having an RF input port coupled to the RF output port of the digital-to-RF modulator and having a like plurality of RF output ports with each of the RF output ports coupled to an RF input port of a respective one of the plurality of RF amplifiers; at least one voltage control unit to provide variable supply voltages to the first and second RF amplifiers in response to at least one control signal; and a controller to receive input data and to provide the input information to the digital-to-RF modulator and the at least one control signal to the at least one voltage control unit based, at least in part, upon the received input data.

In various embodiments, an RF amplification system further comprises an RF power combiner to combine amplified RF signals received from the plurality of RF amplifiers into a combined signal. In some embodiments, the RF power divider is configured to split the modulated RF signal into a plurality of RF signals having relative phases delays and wherein the RF power combiner is configured to match the relative phase delays such that the amplified RF signals are combined in phase.

The RF power divider may include a Wilkinson divider, a transmission-line splitter, a lumped-element splitting network, or a hybrid coupler. Similarly, the RF power combiner may include a Wilkinson combiner, a hybrid combiner, a Chireix combiner, a non-isolating combiner, transmission lines, a lumped-element reactive combiner, or a Doherty combiner.

In certain embodiments, at least one RF power divider is configured to split the modulated RF signal into a first RF signal having a first power level and a second RF signal having a second power level. The first and second power levels may be selected based upon power ratings for a first and second one of the plurality of RF amplifiers, respectively.

In some embodiments, at least one voltage control unit is configured to provide variable supply voltages selected from a plurality of discrete voltage levels. The at least one voltage control unit may be configured to generate the discrete voltage levels using a single-input, multiple-output power converter. In certain embodiments, the single-input, multiple-output power converter is provided as a switched-capacitor converter, a resonant switched-capacitor converter, or a single-inductor multiple-output converter. In some embodiments, at least one voltage control unit comprises transition shaping filters.

In several embodiments, an RF amplification system comprises a plurality of voltage control units to provide variable supply voltages to respective ones of the plurality of RF amplifiers.

BRIEF DESCRIPTION OF THE DRAWINGS

The concepts, structures, and techniques sought to be protected herein may be more fully understood from the following detailed description of the drawings, in which.

The drawings are not necessarily to scale, or inclusive of all elements of a system, emphasis instead generally being placed upon illustrating the concepts, structures, and techniques sought to be protected herein.

DETAILED DESCRIPTION

Figure 1:
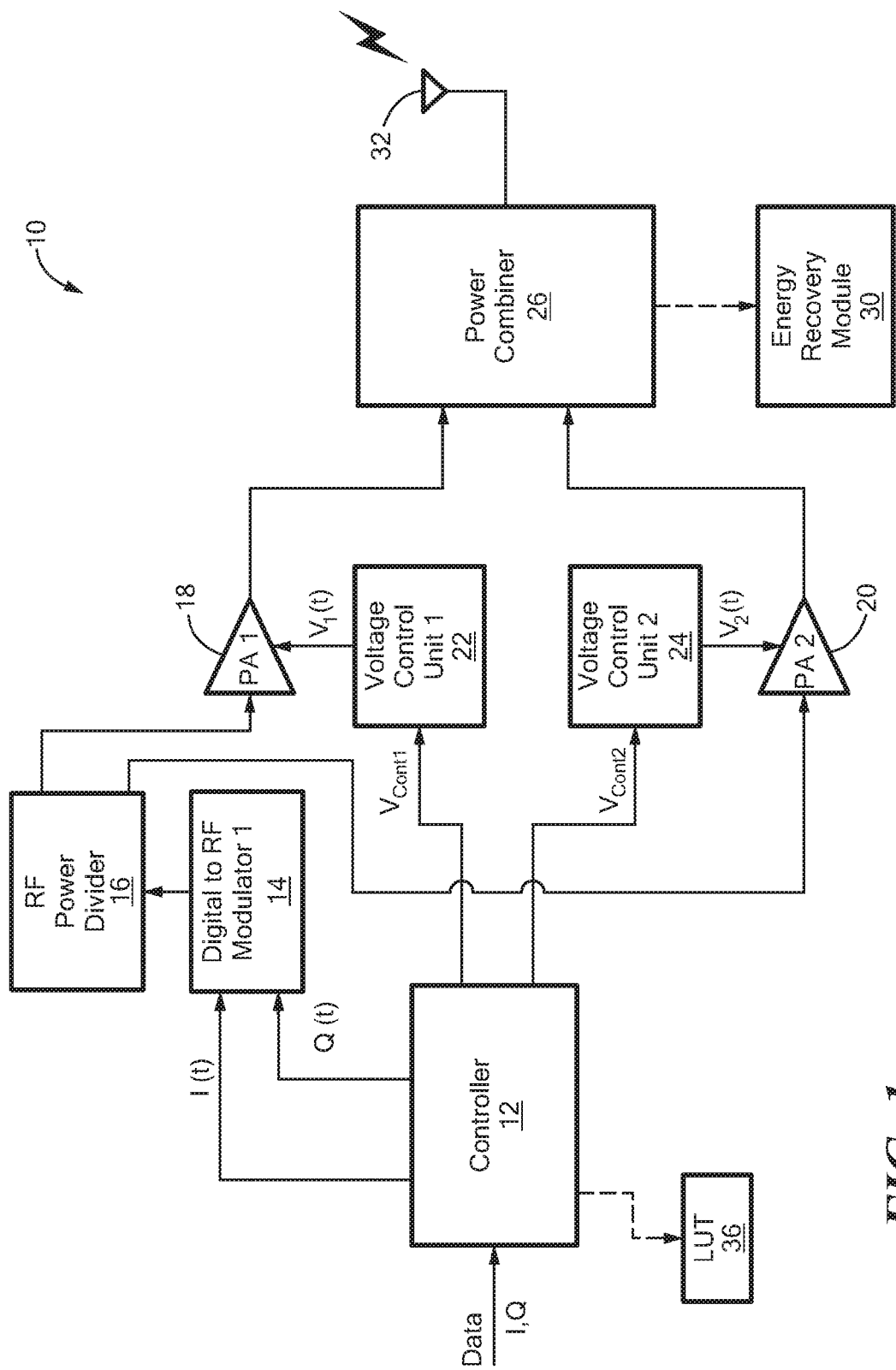
FIG. 1 is a block diagram showing a two-way radio frequency (RF) amplification system having a single digital-to-RF signal path and a multiple voltage control units.

Referring to FIG. 1, a radio frequency (RF) amplification system 10 includes a digital controller 12, a digital-to-RF modulator 14, an RF power divider 16, first and second RF amplifiers 18, 20, first and second voltage control units 22, 24, and an RF power combiner 26. Since the illustrative amplification system 10 includes two RF amplifiers, the system may be referred to as a two-way RF amplification system. Furthermore, in embodiments in which the RF amplifiers are provided as power amplifiers (PAs) 18, 20, the system may be referred to as a two-way power amplification system. The RF power amplification system 10 may correspond to an RF transmitter coupled to one or more antennas 32 and/or other transducers (or a transmission line) to facilitate the transmission of RF signals to one or more remote entities (e.g., remote wireless entities).

In some embodiments, the system 10 further includes an energy recovery module 30 coupled to RF power combiner 26.

Controller 12 includes an input to receive or otherwise obtain a stream of digital data to be amplified by the system 10 (i.e., transmit data). The transmit data may be in any suitable format (e.g., a binary bit stream; I and Q data; etc.). Controller 12 may use this transmit data, among other things, to provide input information to the digital-to-RF modulator 14 and control signals to first and second voltage control units 22, 24 that, in the example shown, will result in the transmission of the transmit data from antenna 32. Controller 12 may include any type of circuit, component, or system that is capable of performing the corresponding functions and operations described herein.

In various embodiments, the controller 12 provides digital signals (e.g., I and Q data) to the digital-to-RF modulator 14. In some implementations, the input information provided to the digital-to-RF modulator 14 may be in a format other than I and Q. For example, amplitude and phase information may be delivered to the digital-to-RF modulator 14 by controller 12.

As will become apparent form the description below, the controller can use the input information delivered to the digital-to-RF modulator 14 (e.g., an amplitude value associated with I and Q) to control/adjust a power level output by the system 10 (e.g., a transmit power level). For example, controller 12 may provide a reduced amplitude value for the digital-to-RF modulator 14 when a lower transmit power level is desired.

In various embodiments, the controller 12 adjusts control signals $V_{Cont1}$, $V_{Cont2}$ provided to the voltage control units 22, 24 and/or the input information provided digital-to-RF modulator 14 dynamically (e.g., in real-time) based on the received transmit data. For example, the controller 12 may dynamically select commands for the voltage control units 22, 24 that result in a discrete drain bias level (i.e., a supply voltage level) for each of the first and second PAs 18, 20. The controller may use level selection techniques described in U.S. Pat. No. 8,824,978.

In some embodiments, controller 12 is configured to update the information delivered to digital-to-RF modulator 14 and/or the control signals delivered to first and second voltage control units 22, 24 on a sample-by-sample basis. In at least one implementation, controller 12 is configured to provide independent control to each of first and second voltage control units 22, 24 so that different supply voltages can be simultaneously applied to first and second PAs 18, 20.

As described below, the output of the single digital-to-RF modulator 14 is split by the RF power divider 16 (e.g., an RF divider network) to drive the RF inputs of the two PAs 18, 20. To achieve high linearity, the controller 12 may utilize linearization techniques, e.g., digital predistortion with training feedback from the RF output. Linearization techniques such as supply-selection-dependent digital predistortion (DPD) and training methods, pulse cancellation (injected via corrections of the data inputs into the single digital-to-RF modulator), etc., can all be used for performance improvement, as in a dual-digital path AMBO system.

The digital-to-RF modulator 14 includes any suitable type of circuits or components operable to receive input information from the controller 12 and to generate an analog RF signal that enables an accurate representation of the transmit data to be provided at the antenna 32. In certain embodiments, the digital-to-RF modulator 14 is capable of converting digital input information representative of time-varying amplitude and phase into an analog RF output signal having corresponding amplitude and phase characteristics. The RF output of the digital-to-RF modulator 14 may be coupled directly to the RF power divider 16, as shown, or there may be one or more stages of amplitude adjustment (e.g., amplification or attenuation), impedance matching, and/or phase adjustment circuitry coupled between the modulator 14 and the power divider 16.

The system 10 may use any suitable modulation and coding scheme (MCS) to represent the transmit data within the RF transmit signal. For example, the system 10 may use binary phase shift keying (BPSK), quadrature phase shift keying (QPSK), quadrature amplitude modulation (e.g., QAM, 16 QAM, 64 QAM, 128 QAM, etc), orthogonal frequency division multiplexing (OFDM), Code Division Multiple Access and/or other ways or encoding information and may meet the needs of transmit systems suitable for single or multi-carrier LTE or GSM standards. Some of these result in transmit signals that have relatively high peak to average power ratios. As is well known, transmit signals having high peak to average power ratios typically require highly linear power amplification to provide an accurate representation of transmit data. In various embodiments described herein, transmission systems and techniques are described that are capable of providing efficient power amplification with sufficient linearity to support transmit signals having high peak to average power ratios.

The RF power divider 16 may include any type of circuits or components operative to receive modulated RF signals from the digital-to-RF modulator 14 and to divide (or "split") the modulated RF signals into a plurality of RF signals which may be provided as inputs to a plurality of PAs. In the example shown, the power divider 16 splits a digital input signal (e.g., an I/Q signal pair) into first and second RF input signals to drive the first and second PAs 18, 20, respectively. The power divider 16 may also be referred to as an "RF splitter."

In some embodiments, the RF power divider 16 may be realized with a Wilkinson divider, a divider based on a transmission-line splitter, a lumped-element splitting network, or a hybrid circuit such as a rat-race hybrid coupler or a branch-line hybrid coupler used as a divider.

In various embodiments, the power divider 16 is configured to provide a predetermined fixed impedance to the digital-to-RF converter 14 regardless of the loading provided by the PA inputs. Those skilled in the art will understand that this can be provided, for example, using a hybrid coupler as a divider loaded with the matching PA inputs, as in a balanced amplifier. In other embodiments, the power divider 16 does not preserve fixed input impedance as the loading impedances vary.

In some embodiments, the power divider 16 is configured to generate RF output signals that are substantially aligned in phase. However, in some applications it may be preferable to have the PA input signals not aligned in phase. Here, the relative delays (i.e., phase shifts) of the divider 16 output signals may be selected to match and/or compensate for phase shifts of the power combiner 26 such that the RF outputs of the PAs 18, 20 combine in phase in the combiner 26. As such, the net delays through the two RF paths to the output (e.g., to antenna 32) can be matched.

For example, if the phase of the power divider output coupled to the first PA 18 leads the phase of the power divider output signal coupled to the second PA 20 by 90 degrees, then the power combiner 26 may be configured such that the phase from the first input of the combiner (connected to the output of the first PA 18) to the RF output lags, by 90 degrees, the phase from the second input of the combiner (connected to the output of the second PA 20) to the RF output. Such phase-delay matching can be achieved, for example, using a 90 degree coupler (e.g., a branchline hybrid coupler) within both power divider 16 and within power combiner 26.

As another example, phase-delay matching can be achieved by matching a rat-race hybrid used as a divider 16 with a rat-race hybrid used as a combiner 26 to appropriately match phases of the two paths to the output. As yet another example, phase-delay matching can be achieved using suitable length transmission lines coupled in the signal paths between outputs of the power divider 16 and/or inputs of the power combiner 26.

In various embodiments, the RF power divider 16 is configured to split input power (i.e., power in the RF signal received from the digital-to-RF modulator 14) equally among the PAs 18, 20. This may be preferred, for example, when the PAs are identical or similarly rated (or "sized"). In other embodiments—e.g., where the PAs 18, 20 have different power ratings (or "sizes")—the power divider 16 may be configured to deliver unequal RF power to the PAs. In such a system with asymmetrical power dividing and/or power amplification, the power combiner 26 may likewise be configured for asymmetrical power combining such that maximum combining efficiency is achieved with asymmetrical power inputs from the PAs.

It will also be noted that the RF inputs to the PAs 18, 20 can be designed to remain constant impedance, or can be designed to vary under drive or drain-bias-voltage level. These design choices can affect how power is split among the PAs under different operating conditions, and may also affect the loading on the digital-to-RF modulator 14. Such loading effects may be accounted for (e.g., by compensation circuits or techniques) to yield desired a desired result.

In some embodiments, the power divider 16 is provided on the same circuit board or substrate as the PAs 18, 20 and/or upon the same circuit board/substrate as the power combiner 26. In other embodiments, the power divider 16 is provided on a different circuit board or substrate.

In some embodiments, the RF power divider 16 may be provided as an isolating power splitter. In certain embodiments, isolating power splitter with energy recovery may be used, such as the systems described in U.S. Pat. No. 8,830,710, Sep. 9, 2014 (entitled "RF Energy Recovery System") and U.S. Pat. No. 8,830,709 (entitled "Transmission-Line Resistance Compression Networks and Related Techniques). In some embodiments, the RF power splitter 16 may utilize a transformer splitter, a Wilkinson splitter, a rat-race hybrid used as a splitter, or another type of other combiner or hybrid coupler circuits for power splitting. Further, the RF power splitter 16 can be provided as a type of non-isolating splitter, including a Resistance Compression Network, a splitter based on transmission lines (e.g., two quarter-wave transmission lines connected at one end), a lumped-element reactive splitter, or a Doherty splitter.

In some embodiments, power divider or splitter 16 may be an isolating splitter having an isolation port. As is known, an isolating splitter will sometimes output energy at the isolation port due to, for example, mismatches, imbalances, and/or reflections in the circuitry coupled to the splitter. Typically, a resistive termination will be coupled to the isolation port of an isolating splitter to provide an impedance match for the port and to dissipate any energy output from the port. Thus, in some embodiments, an energy recovery module (not shown) may be coupled to the isolation port of an isolating splitter, rather than a conventional resistive termination, for use in recovering some or all of the energy that would otherwise have been dissipated. Recovering energy from the splitter 16 may be less important than for the power combiner 26 owing to the lower relative power level, but may nonetheless be of value in achieving high efficiency. The energy recovery module (not shown) may include circuitry for converting the recovered energy into a useful form. For example, the recovered energy may be converted to a form that can be used to charge a battery. Alternatively, the recovered energy may be converted to a form that may be used to energize other circuitry within system 10.

First and second PAs 18, 20 may be provided as any type of power amplifier capable of amplifying an RF signal (e.g., a signal output from power divider 16). In some implementations, first and second PAs 18, 20 may be non-linear amplifiers (and, in some cases, highly non-linear amplifiers) to improve the efficiency of operation of the amplification system 10. First and second PAs 18, 20 may use the same amplifier design or different amplifier designs.

In some embodiments, the PAs 18, 20 have an input coupled to a respective output of the RF power divider 16, a drain bias input coupled to a respective one of the voltage control units 22, 24, and an output coupled to a respective input of the power combiner 26.

The PAs 18, 20 may have one or more stages of RF power amplification. As with other AMBO systems (e.g., systems described in U.S. Pat. No. 8,824,978), many types of PAs may be employed, including all the major classes (A, AB, B, C, D, E, F, inverse F, J, etc.) as well amplifiers containing multiple sub-amplifiers (e.g., Doherty Amplifiers, and Balanced Amplifiers). In some embodiments, the PAs 18, 20 are provided as RF-input outphasing amplifiers, such as those described in U.S. patent application Ser. No. 14/823,220 filed on Aug. 11, 2015 (entitled "RF-Input/RF-Output Outphasing Amplifier").

First and second voltage control units 22, 24 may be provided as any type of circuit, component, or system operative for providing variable supply voltages to first and second PAs 18, 20, respectively, based on control signals received from controller 12. The voltage control units 22, 24 may include, for example, variable power supplies, discrete power supplies, batteries, multi-level power converters, and/or switching circuits that are capable of switching between preset voltage potentials.

In some embodiments, the voltage control units 22, 24 provide drain bias voltages to the PAs that may be may be dynamically selected to be different voltages. The voltage control units 22, 24 may each select a drain bias from two or more discrete levels, though other voltage control unit designs are possible, including those that provide a continuously adjustable output. As with other AMBO systems (such as the systems described in U.S. Pat. No. 8,824,978), the voltage control units 22, 24 may include transition-shaping filters. The discrete levels for the voltage control units may optionally be generated from a single power supply input using single-input, multi-output power converter such as a switched-capacitor converter, resonant switched-capacitor converter, single-inductor multiple-output converter, etc., or using multiple power supplies.

In some implementations, first and second voltage control units 22, 24 may be capable of providing one of a plurality of predetermined voltages to respective PAs 18, 20 in response to control signals from controller 12. Thus, a control signal $V_{CONT1}$ may select a voltage value for PA 18 and a control signal $V_{CONT2}$ may select a voltage value for PA 20. As with the input information applied to the digital-to-RF modulator 14, the supply voltage values applied to first and second PAs 18, 20 may change on a sample-by-sample basis in some embodiments.

Power combiner 26 may be provided from any type of device or structure operative for combining the output signals of first and second PAs 18, 20 to generate an RF transmit signal at an output thereof. The RF transmit signal may then be delivered to antenna 32 for transmission into a wireless channel. As will be appreciated, the RF transmit signal should include an accurate representation of the original transmit data (e.g., the data provided as input to controller 12).

In some embodiments, the RF power combiner 26 may be provided as an isolating power combiner. In certain embodiments, isolating power combiner with energy recovery may be used, such as the systems described in U.S. Pat. No. 8,830,710 (entitled "RF Energy Recovery System") and U.S. Pat. No. 8,830,709 (entitled "Transmission-Line Resistance Compression Networks and Related Techniques). In some embodiments, the RF power combiner 26 may utilize a transformer combiner, a Wilkinson combiner, a rat-race hybrid used as a combiner, or another type of other combiner or hybrid coupler circuits for power combining. Further, the RF power combiner 26 can be provided as a type of non-isolating combiner, including a Chireix combiner, a combiner based on transmission lines (e.g., two quarter-wave transmission lines connected at one end), a lumped-element reactive combiner, or a Doherty combiner.

In some embodiments, power combiner 26 may be an isolating combiner having an isolation port. As is known, an isolating combiner will sometimes output energy at the isolation port due to, for example, mismatches, imbalances, and/or reflections in the circuitry coupled to the combiner. Typically, a resistive termination will be coupled to the isolation port of an isolating combiner to provide an impedance match for the port and to dissipate any energy output from the port. Thus, in some embodiments, an energy recovery module 30 may be coupled to the isolation port of an isolating combiner, rather than a conventional resistive termination, for use in recovering some or all of the energy that would otherwise have been dissipated. Energy recovery module 30 may include circuitry for converting the recovered energy into a useful form. For example, the recovered energy may be converted to a form that can be used to charge a battery. Alternatively, the recovered energy may be converted to a form that may be used to energize other circuitry within system 10.

In some embodiments, power combiner 26 may be implemented upon the same circuit board or substrate as the PAs 18, 20 and/or upon the same circuit board/substrate as the power divider 16. In other embodiments, power divider 26 is provided as a separate circuit element.

Although the illustrative RF amplification system 10 of FIG. 1 includes two PAs 18, 20 and two voltage control units 22, 24, it will be appreciated that the structures, concepts, and techniques described above can be generalized to systems having two or more PAs, one or more voltage control units, and one or more digital-to-RF signal paths.

It is appreciated that the generalized system architecture described above in conjunction with FIG. 1 provides a number of design benefits over existing RF amplification systems. For example, use of the RF split results in a system which only requires a single digital-to-RF modulator. System 10 thus provides a cost advantage over existing systems by eliminating the need for additional digital-to-RF modulators. It will be understood that the associated data converters and I/Q modulator that comprise a digital-to-RF modulator can be relatively expensive, especially in low-power systems. Moreover, the control complexity of the system can be substantially reduced as compared to a "dual digital" system, in that linearization only needs to manage one path for digital predistortion, pulse cancellation, etc., and one eliminates the need for calibration of time alignment of the multiple digital-to-RF paths. Owing to these complexity reductions and time alignment benefits, efficient performance to higher signal bandwidths can be achieved. Further, the reduced complexity means that the RF amplification system architecture described herein scales well to many-way AMBO systems, such as the systems shown in FIGS. 3 and 4 and described below in conjunction therewith.

Figure 2:
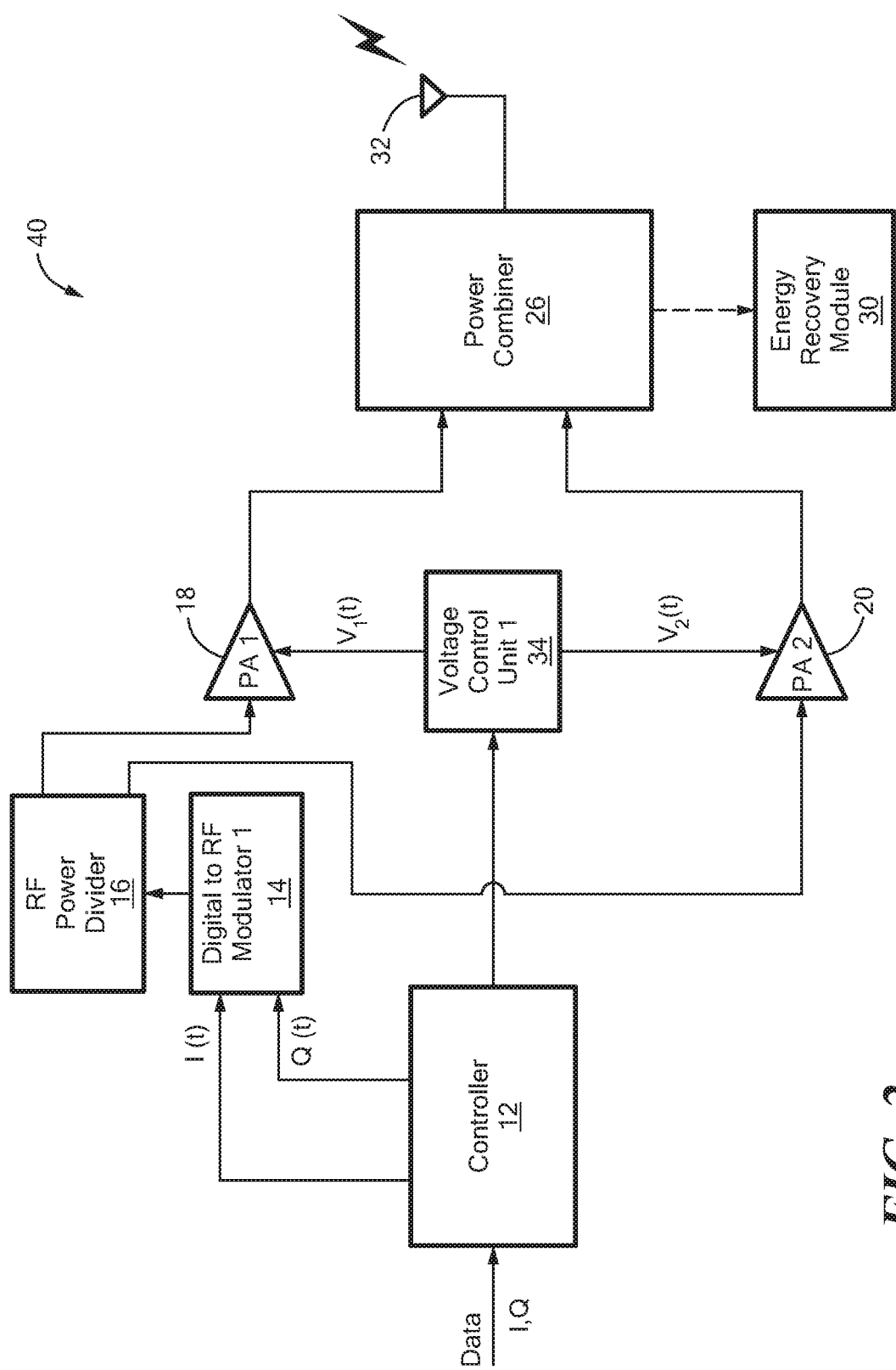
FIG. 2 is a block diagram showing a two-way RF amplification system having a single digital-to-RF signal path and a single voltage control unit.

Referring to FIG. 2, in which like elements of FIG. 1 are shown using like reference designators, an illustrative RF amplification system 40 includes a single voltage control unit 34 configured to provide variable voltages to multiple PAs (here two PAs 18, 20). Although one signal path is deprecated between the controller 12 and the voltage control unit 34 in FIG. 2, it should be appreciated that multiple control signals could be sent from the controller 12 to the voltage control unit 34. In some embodiments, a M-bit digital control signal is used.

Figure 3:
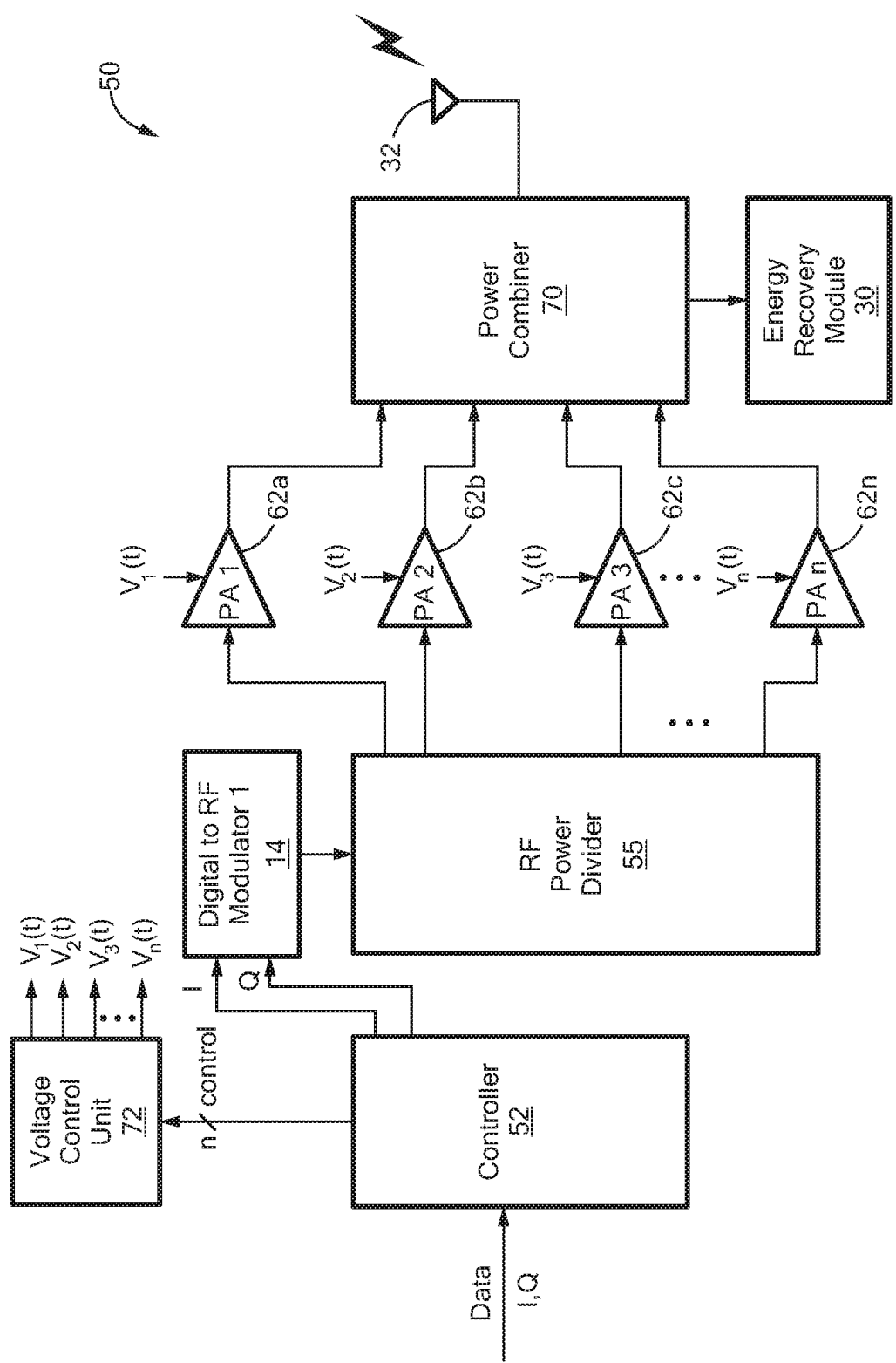
FIG. 3 is a block diagram showing an N-way RF amplification system having a single digital-to-RF signal path.

Referring to FIG. 3, in which like elements of FIGS. 1 and 2 are shown using like reference designators, an RF amplification system can utilize an arbitrary number (N) of PAs and, thus, may be referred to as an N-way or many-way amplification system. An illustrative RF amplification system 50 includes N PAs 62a, 62b, 62c, . . . , 62n (generally denoted 62), each having an RF input coupled to a respective output of an N-way power divider 55, and an RF output coupled to a respective output of an N-way power combiner 70, as shown. Any of the PAs 62 may be the same as or similar to the PAs 18, 20 described above in conjunction with FIG. 1.

As shown, the system 50 may include an N-way voltage control unit 72, operative to receive one or more control signals from a controller 52 and to generate N variable supply voltages, each of which is applied to a respective one of the N PAs 62. In some embodiments, voltage control unit 72 is a digital control signal that encodes information to select levels for the N PAs 62. In other embodiments, an N-way RF amplification system 50 may include multiple voltage control units 72, each configured to apply a variable supply voltage to one or more of the PAs 62.

As with the embodiments of FIGS. 1 and 2, the illustrative system 50 may utilize a single digital-to-RF modulator 14. Thus, it will be appreciated that the N-way AMBO system architecture shown in FIG. 3 provides an economical way to achieve high power levels using relatively low-power PAs and voltage control units.

It should be appreciated that the power divider 55 can have any number of output ports so desired, including an odd number of output ports. For example, a 3-way Wilkinson divider comprising three lines and three resistive connections could be used.

Figure 4:
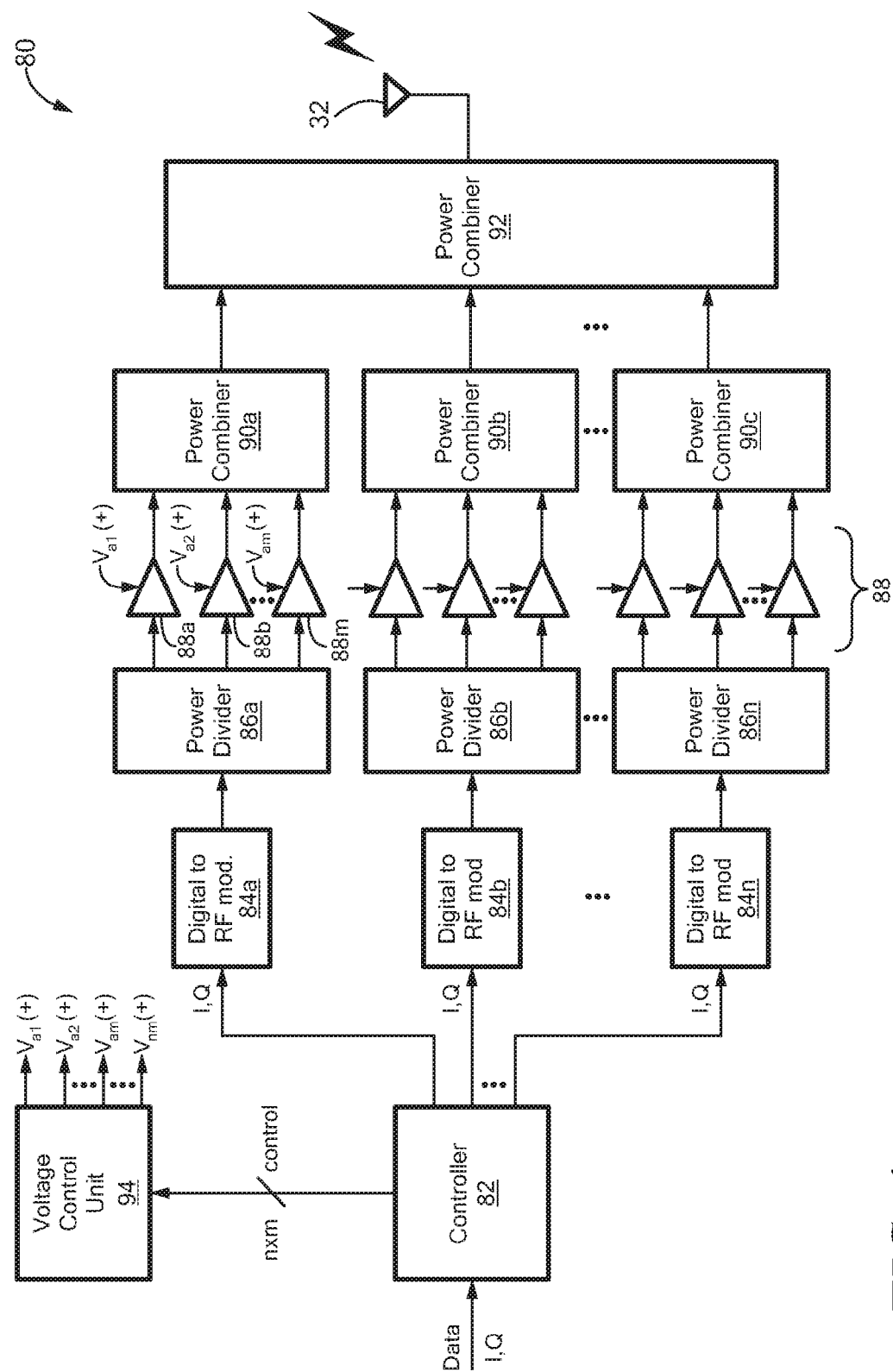
FIG. 4 is a block diagram showing an RF amplification system having a multiple digital-to-RF signal paths, each of which includes a power divider having a plurality of power dividers.

Referring to FIG. 4, in which like elements of FIGS. 1-3 are shown using like reference designators, a N-way AMBO system can include a combination of digital-to-RF signal paths and RF-splits. In this example, a RF amplification system 80 includes N digital-to-RF paths (realized by N digital-to-RF modulators 84a, 84b, 84n) each having M RF-splits (realized by respective M-way power dividers 86a . . . 86n) to drive a total of N×M PAs 88.

Digital-to-RF modulator 84a, which may be representative of any other digital-to-RF modulator 84, has an input coupled to receive input information (e.g., I/Q data) from a controller 82, and an RF output coupled to a respective one of a plurality of power dividers 86a, 86b, . . . 86n (generally denoted 86, with digital-to-RF modulator 84 being coupled to power divider 86a in this example). The illustrative power divider 86a has outputs coupled to respective RF inputs of M PAs 88a, 88b, . . . 88m, as shown. The outputs of PAs 88a, 88b, . . . 88m are combined with each other, and also with the outputs of all other PAs 88 to result in a system RF output signal for transmission via an antenna 32.

In this example, two levels of power combining are used. A first level corresponds to a plurality of M-way power combiners 90a . . . 90n, each of which may have inputs coupled to M respective of PAs and an output. The outputs of the first level power combiners 90a . . . 90n may be coupled as inputs to an N-way power combiner 92, which provides the second level of power combining. In other embodiments, the amplification system 80 could utilize a single level of power combining, such as a single power combiner having N×M inputs, or more than two levels of power combining. It should be appreciated that in some applications, it may be desirable or necessary to use only single level (or stage) or power combiners, for example by omit power combiners 90a, 90b, 90c and having a power combiner 92 having N inputs.

The illustrative system 80 also includes a voltage control unit 94 configured to receive N×M control signals from the controller 82 and to apply N×M supply voltages to respective ones of the N×M PAs 88. As illustrated in FIG. 1, multiple voltage control units 94 can also be used.

It should be appreciated that any of the techniques, control and linearization methods, and design variants described in U.S. Pat. No. 8,824,978 in conjunction with so-called "dual digital" path AMBO systems can be applied to the concepts, systems, and structures sought to be protected herein.

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A radio frequency (RF) amplification system, comprising:
   a digital-to-RF modulator having an input adapted to receive a digital signal and having an RF output port;
   an RF power divider having an input coupled to the RF output port of said digital-to-RF modulator and having a plurality of output ports;
   a like plurality of RF amplifiers each of said RF amplifiers having an input port coupled to a respective one of the plurality of output ports of said RF power divider;

at least one voltage control unit having an input and having an output coupled to at least one of said plurality of RF amplifiers, each of said at least one voltage control units configured such that in response to a control signal provided to the input thereof, each of said at least one voltage control units provides a variable supply voltage at the output thereof; and a controller to receive input data and to provide the input information to said digital-to-RF modulator and the at least one control signal to said at least one voltage control unit based, at least in part, upon the received input data.

2. The RF amplification system of claim 1 further comprising an RF power combiner to combine amplified RF signals received from the plurality of RF amplifiers into a combined signal.

3. The RF amplification system of claim 2 wherein the RF power divider is configured to split the modulated RF signal into a plurality of RF signals having relative phases delays and wherein the RF power combiner is configured to match the relative phase delays such that the amplified RF signals are combined in phase.

4. The RF amplification system of claim 2 wherein the RF power divider comprises a Wilkinson divider, a transmission-line splitter, a lumped-element splitting network, or a hybrid coupler.

5. The amplification system of claim 2 wherein the RF power combiner comprises a Wilkinson combiner, a hybrid combiner, a Chireix combiner, a non-isolating combiner, transmission lines, a lumped-element reactive combiner, or a Doherty combiner.

6. The amplification system of claim 2 wherein the at least one RF power divider is configured to split the modulated RF signal into a first RF signal having a first power level and a second RF signal having a second power level.

7. The amplification system of claim 6 wherein the first and second power levels are selected based upon power ratings for a first and second one of the plurality of RF amplifiers, respectively.

8. The RF amplification system of claim 2 wherein the at least one voltage control unit is configured to provide variable supply voltages selected from a plurality of discrete voltage levels.

9. The RF amplification system of claim 8 wherein the at least one voltage control unit is configured to generate the discrete voltage levels using a single-input, multiple-output power converter.

10. The RF amplification system of claim 9 wherein the single-input, multiple-output power converter is provided as a switched-capacitor converter, a resonant switched-capacitor converter, or a single-inductor multiple-output converter.

11. The RF amplification system of claim 8 wherein the at least one voltage control unit comprises transition shaping filters.

12. The RF amplification system of claim 2 comprising a plurality of voltage control units to provide variable supply voltages to respective ones of the plurality of RF amplifiers.

13. A radio frequency (RF) amplification system, comprising:

a digital-to-RF modulator having a digital input port and an RF output port;

a plurality of RF amplifiers, each of the RF amplifiers having an RF input port and an RF output port;

an RF power divider having an RF input port coupled to the RF output port of the digital-to-RF modulator and having a like plurality of RF output ports with each of the RF output ports coupled to an RF input port of a respective one of the plurality of RF amplifiers;

at least one voltage control unit to provide variable supply voltages to the first and second RF amplifiers in response to at least one control signal; and a controller to receive input data and to provide the input information to the digital-to-RF modulator and the at least one control signal to the at least one voltage control unit based, at least in part, upon the received input data.

14. The RF amplification system of claim 13 further comprising an RF power combiner to combine amplified RF signals received from the plurality of RF amplifiers into a combined signal.

15. The RF amplification system of claim 14 wherein the RF power divider is configured to split the modulated RF signal into a plurality of RF signals having relative phases delays and wherein the RF power combiner is configured to match the relative phase delays such that the amplified RF signals are combined in phase.

16. The RF amplification system of claim 14 wherein the RF power divider comprises a Wilkinson divider, a transmission-line splitter, a lumped-element splitting network, or a hybrid coupler.

17. The amplification system of claim 14 wherein the RF power combiner comprises a Wilkinson combiner, a hybrid combiner, a Chireix combiner, a non-isolating combiner, transmission lines, a lumped-element reactive combiner, or a Doherty combiner.

18. The amplification system of claim 14 wherein the at least one RF power divider is configured to split the modulated RF signal into a first RF signal having a first power level and a second RF signal having a second power level.

19. The amplification system of claim 18 wherein the first and second power levels are selected based upon power ratings for a first and second one of the plurality of RF amplifiers, respectively.

20. The RF amplification system of claim 14 wherein the at least one voltage control unit is configured to provide variable supply voltages selected from a plurality of discrete voltage levels.

21. The RF amplification system of claim 20 wherein the at least one voltage control unit is configured to generate the discrete voltage levels using a single-input, multiple-output power converter.

22. The RF amplification system of claim 21 wherein the single-input, multiple-output power converter is provided as a switched-capacitor converter, a resonant switched-capacitor converter, or a single-inductor multiple-output converter.

23. The RF amplification system of claim 20 wherein the at least one voltage control unit comprises transition shaping filters.

24. The RF amplification system of claim 14 comprising a plurality of voltage control units to provide variable supply voltages to respective ones of the plurality of RF amplifiers.

* * * * *